(12) United States Patent
Kawai et al.

(10) Patent No.: US 6,635,561 B2
(45) Date of Patent: Oct. 21, 2003

(54) SEMICONDUCTOR DEVICE, AND METHOD OF MANUFACTURING THE SEMICONDUCTOR DEVICE

(75) Inventors: Kenji Kawai, Tokyo (JP); Hajime Kimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/909,780

(22) Filed: Jul. 23, 2001

(65) Prior Publication Data

US 2001/0050390 A1 Dec. 13, 2001

(30) Foreign Application Priority Data

Jan. 26, 2001 (JP) ......................................... 2001-019242

(51) Int. Cl.[7] .......................................... H01L 21/4763
(52) U.S. Cl. ....................... 438/622; 438/253; 438/255; 438/397; 438/404
(58) Field of Search ................................ 438/622, 255, 438/964, 253, 771, 240, 402, 404, 398, 674, 399, 665, 254, 256, 396, 397, 618, 239, 243, 386

(56) References Cited

U.S. PATENT DOCUMENTS 6,159,793 A  * 12/2000  Lou ........................... 438/255
6,429,127 B1 * 8/2002 Derderian et al. ........... 438/686
2001/0006838 A1 * 7/2001 Won et al. ................... 438/396

FOREIGN PATENT DOCUMENTS

JP          09-092798          4/1997
JP          11-220101          8/1999

* cited by examiner

*Primary Examiner*—Matthew Smith
*Assistant Examiner*—Igwe U. Anya
(74) *Attorney, Agent, or Firm*—McDermott, Will & Emery

(57) ABSTRACT

An attempt is made to achieve an upward leap in the capacitance of a capacitor of MIM structure and further improvements in the reliability of a semiconductor device. A method of manufacturing a semiconductor device has a step of forming an amorphous silicon film on the surface of a lower electrode of a capacitor, a step for roughening the silicon film, to thereby form rough polysilicon, and a step for etching metal film of a lower electrode while the rough polysilicon is taken as a mask, thereby roughening the surface of the lower electrode. Through the foregoing steps, the surface of a lower electrode of a capacitor of MIM (metal/insulator/metal) structure is formed roughly, thereby increasing the surface area of the capacitor. Thus, a large-capacitance capacitor of MIM structure can be fabricated.

1 Claim, 10 Drawing Sheets enlarged view initial surface of lower electrode enlarged view
initial surface of lower electrode

SEMICONDUCTOR DEVICE, AND METHOD OF MANUFACTURING THE SEMICONDUCTOR DEVICE

BACKGROUND OF THE INVENTION

1. Field of the Invention

The present invention relates to a semiconductor device and a method of manufacturing the semiconductor device, and more particularly, to a semiconductor device having a capacitor and to a manufacturing method suitable for the semiconductor device.

2. Background Art

In recent years, in association with miniaturization of a semiconductor device, various approaches have been taken for ensuring a sufficient amount of capacitance in a cell area that has been scaled down for increasing storage capacity in a semiconductor device having a capacitor; e.g., DRAM (dynamic random access memory). For instance, there has been studied a method of using a high dielectric film, such as $Ta_2O_5$ (tantalum(V) oxide), BST (an abbreviation of $Ba Sr_{1\ to\ x} TiO_3$), and PZT (a ferroelectric formed from a solid solution consisting of a ferroelectric $PbTiO_3$ and an antiferroelectric $PbZrO_3$), as a dielectric film (also called a capacitive dielectric film) sandwiched between an upper electrode and a lower electrode of the capacitor.

The dielectric constant of a high dielectric film, such as $Ta_2O_5$, is about several times that of a conventional silicon oxynitride (SiON) film. Hence, so long as the high dielectric film is used as a capacitive dielectric film of a capacitor, there can be ensured sufficient capacitance required for accumulating electric charges in the capacitor even when the surface areas of electrodes of the capacitor become smaller in accordance with the area of a miniaturized cell. ($C = \in S/d$ C: capacitance of a capacitor, $\in$: dielectric constant, S: the area of the capacitor, and d: the thickness of the dielectric film)

Each of the high dielectric films is formed in an oxidizing atmosphere. When polysilicon is used as material for electrodes of a capacitor as conventionally, the surfaces of the electrodes are oxidized, resulting in formation of a silicon oxide film having a low dielectric constant and spreading of a depletion layer. For these reasons, even when a high dielectric film is consciously used as a capacitive dielectric film, a dielectric film is formed on the surface of electrodes as a result of oxidation. Accordingly, a capacitive dielectric film becomes thick correspondingly, resulting in a drop in capacitance of a capacitor.

Because of such a problem, there has been performed a study on a capacitor having an MIM (metal/insulator/metal) structure which uses, as a lower electrode, platinum (Pt) having strong acid resistance or ruthenium (Ru) whose metallic oxide ($RuO_2$) has conductivity, rather than a conventional SIS (silicon/insulator/silicon) capacitor or a MIS (metal/insulator/semiconductor) capacitor.

A related-art method of manufacturing a semiconductor device having a capacitor will now be described by reference to FIGS. 9A through 9F and FIGS. 10A through 10C.

As shown in FIGS. 9A through 10C, a first interlayer insulating film 101 is formed on a silicon substrate 100. After a resist pattern 102 has been formed on the first interlayer insulating film 101, a first hole 103 is formed in the first interlayer insulating film 101 by means of dry etching (see FIG. 9A).

After removal of the resist pattern 102, the first hole 103 is filled with a first conductive film 104 (e.g., polycrystalline silicon, tungsten (W), or titanium nitride (TiN)) The first conductive film 104 is deposited also on the first interlayer insulating film 101 (see FIG. 9B).

Subsequently, the first conductive film 104 is removed from the first interlayer insulating film 101, by means of total etch-back or chemical-and-mechanical polishing (CMP). As a result, a plug 105 of first conductive film is formed within the first hole 103 (see FIG. 9C).

A second interlayer insulating film 106 is formed on the first interlayer insulating film 101 and on the plug 105 of first conductive film. After a resist pattern 107 has been formed on the second interlayer insulating film 106, a second hole 108 is formed in the second interlayer insulating film 106 by means of dry etching (see FIG. 9D). Subsequently, the resist pattern 107 is removed (see, FIG. 9E).

Barrier metal film 109; e.g., TiN (titanium nitride), and metal (e.g., Ru or Pt) film 110 which is to become a lower electrode (i.e., a storage node) of a capacitor are deposited, in this sequence, on the second interlayer insulating film 106 and on the second hole 108 (see FIG. 9F). Deposition of the barrier metal film 109 is intended for preventing reaction, which would otherwise be caused when the metal film 110, which is to become a lower electrode of a capacitor, comes into contact with the plug 105 of first conductive film, or for enhancing adhesion between the second interlayer insulating film 106 and the plug 105 of first conductive film.

Subsequently, the barrier metal film 109 and the metal film 110 which acts as a lower electrode of the capacitor are removed from the upper surface of the second interlayer insulating film 106 (see FIG. 10A), by means of total etch-back or CMP. Here, the second hole 108 maybe embedded with an organic substance, such as resist, before removal of the barrier metal film 109 and the metal film 110, thereby protecting the metal film 110 constituting the lower electrode of the capacitor. The organic substance may be removed after processing.

In order to increase the capacitance of a capacitor, a high dielectric film 111; e.g., $Ta_2O_5$, BST, or PZT, is deposited on the surface of second interlayer insulating film 106 and the metal film 110 constituting the lower electrode of the capacitor. Metal film (e.g., Ru, Pt, or Pt doped with iridium (Ir) for enhancing thermal stability) 112 which is to become an upper electrode of the capacitor (i.e., a cell plate) is deposited so as to fill the second hole 108, thus forming a resist pattern 113 (see FIG. 10B). The resist pattern 113 is removed after dry etching, thus forming a capacitor of MIM structure (see FIG. 10C).

At this time, when the metal film 112 constituting the upper electrode of the capacitor is formed from Ru, etching proceeds by means of reaction of Ru in $O_2$ gas plasma (from Ru to $RuO_2$(conductive) and $RuO_2$ to $RuO_4$ (volatile)). Alternatively, the metal film 112 may be etched by means of $O_2/Cl_2$ (oxygen/chlorine), CO (carbon monoxide), or $CO/Cl_2$ gas.

When the metal film 112 constituting the upper electrode of the capacitor is formed from Pt, the metal film 112 is etched in $Cl_2/Ar$ (chlorine/argon) gas plasma (roughly corresponding to sputtering etching).

Even when there is formed a capacitor of MIM structure which uses a high dielectric film as a capacitive dielectric, larger variations due to process conditions arise in a high dielectric film, particularly when BST or PZT is used. In order to ensure dielectric strength, a high dielectric film must be thick. For this reason, difficulty is encountered in thinly forming a high dielectric film, thus hindering expectation of an upward leap in capacitance of a capacitor.

The invention described in Japanese Patent Application Laid-Open No. 220101/1999 is aimed at increasing the capacitance of a capacitor by means of forming lower electrodes in a columnar shape so as to increase the surface area of the capacitor. When lower electrodes are of columnar shape, the distance between lower electrodes is abruptly reduced in association with miniaturization of a semiconductor device. As a result, etch residues arise in a bottom, and hence a short circuit is apt to arise. Another problem is that columnar lower electrodes themselves become narrow and likely to fall. Thus, the invention yields a problem in terms of reliability of a semiconductor device.

SUMMARY OF THE INVENTION

The present invention has been conceived under such circumstances and is aimed at achieving an upward leap in the capacitance of a capacitor of MIM structure and further improvements in the reliability of a semiconductor device.

According to one aspect of the present invention, a semiconductor device has a capacitor of metal-insulator-metal structure, and the capacitor comprises an upper metal electrode, a lower metal electrode, and a capacitive dielectric film formed between the upper and lower electrodes. Further, the surface of the lower electrode is made rough.

According to another aspect of the present invention, a method of manufacturing a semiconductor device having a capacitor of metal-insulator-metal structure, the capacitor comprising an upper metal electrode, a lower metal electrode, and a capacitive dielectric film formed between the upper and lower metal electrodes, wherein the surface of the lower metal electrode is rough and the lower metal electrode is formed on a surface of a hole or trench formed in an interlayer insulating film, comprises the following steps. An interlayer insulating film is etched, thereby a hole or trench is formed firstly. A lower metal electrode is formed on the surface of the interlayer insulating film including the surface of the hole or trench formed therein secondly. An amorphous silicon film or amorphous metal silicide film is formed on the lower metal electrode thirdly. The amorphous silicon film or the amorphous metal silicide film is roughened, thereby rough polysilicon is formed fourthly. The lower metal electrode is etched while the rough polysilicon is taken as a mask, thereby the surface of the lower metal electrode is roughened fifthly. The rough polysilicon is removed sixthly. The lower metal electrode on the interlayer insulating film is removed such that a portion of the lower metal electrode remains on the surface of the hole or trench seventhly. A capacitive dielectric film is formed on the lower metal electrode eighthly. An upper metal electrode is formed on the capacitive dielectric film ninthly.

According to another aspect of the present invention, a method of manufacturing a semiconductor device having a capacitor comprising an upper metal electrode, a lower metal electrode, and a capacitive dielectric film formed between the upper and lower metal electrodes, wherein the surface of the lower metal electrode is rough and the lower metal electrode is formed on a surface of a hole or trench formed in an interlayer insulating film, comprises the following steps. An interlayer insulating film is etched, thereby a hole or trench is formed firstly. A lower metal electrode is formed in amorphous form on the interlayer insulating film including the surface of the hole or trench formed therein secondly. Nuclei of the same metal as that of the lower metal electrode are formed on the surface of the lower metal electrode and the surface of the lower metal electrode is roughened by means of heat treatment thirdly. The lower metal electrode on the interlayer insulating film is removed such that a portion of the lower metal electrode remains on the surface of the hole or trench fourthly. A capacitive dielectric film is formed on the lower metal electrode fifthly. An upper metal electrode is formed on the capacitive dielectric film sixthly.

According to the present invention, a semiconductor device includes a capacitor of metal-insulator-metal (MIM) structure, and the surface of a lower electrode of the capacitor is formed roughly (irregularly), and hence the surface area of the capacitor is increased. Thus, a large-capacitance capacitor of MIM structure can be formed.

In another aspect, the lower electrode is formed on the wall of a hole or trench of an interlayer insulating film. As a result, there can be prevented a problem of occurrence of a short circuit being liable to arise or a problem of a columnar lower electrode becoming liable to fall, which would otherwise be caused by etch residues formed on the bottom of a lower electrode when the lower electrode is formed into a columnar shape. Thus, a highly-reliable semiconductor device can be provided.

Other and further objects, features and advantages of the invention will appear more fully from the following description.

DETAILED DESCRIPTION OF THE PREFERRED EMBODIMENTS

Embodiments of the present invention will be described herein below by reference to the accompanying drawings.

First Embodiment

Figure 1A:
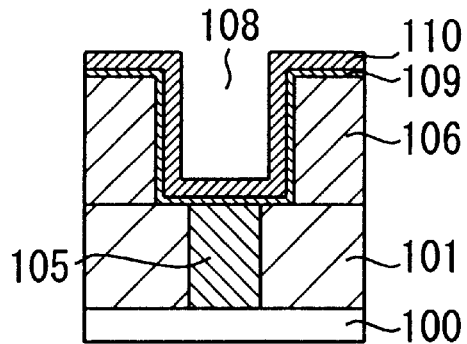
FIGS. 1A to 1E are cross-sectional views schematically depicting a configuration of the semiconductor device and a process for manufacturing the semiconductor device according to the first embodiment of the present invention.

A semiconductor device according to a first embodiment of the present invention and a method of manufacturing the semiconductor device will now be described by reference to FIGS. 1A through 1E and FIGS. 2A through 2C. Processes for forming a structure shown in FIG. 1A are the same as the related-art processes shown in FIGS. 9A through 9F (i.e., the structure shown in FIG. 1A is identical with that shown in FIG. 9F). Accordingly, illustration of the processes and their explanations are omitted here. Here, a second hole 108 may be a trench.

Figure 1B:
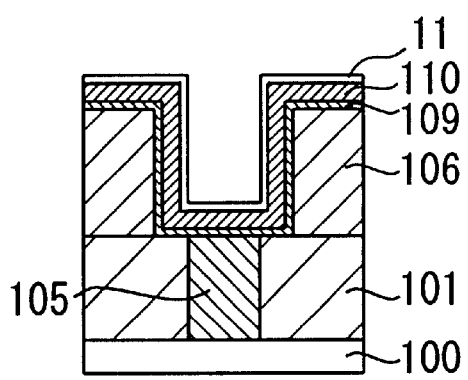
Figure 1C:
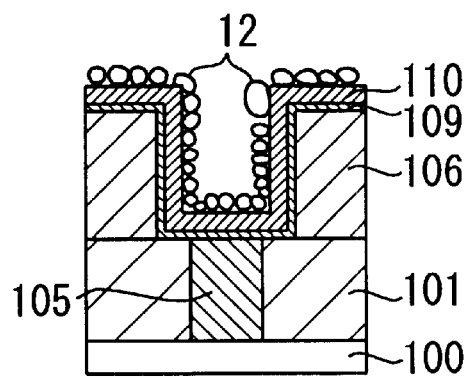

Subsequent to the state shown in FIG. 1A, doped amorphous silicon film 11 is formed on metal film 110 which is to become a lower electrode of a capacitor (see FIG. 1B).

The surface of the doped amorphous silicon film 11 is nucleated by $Si_2H_6$ (disilane), and the doped amorphous silicon film 11 is subjected to heat treatment; for example, vacuum annealing, thereby growing crystal, thereby roughening the surface of the doped amorphous silicon film 11. As a result, roughened polysilicon film 12 is formed, and a portion of the metal film 110 serving a lower electrode of the capacitor is exposed on the surface (see FIG. 1C).

Figure 1D:
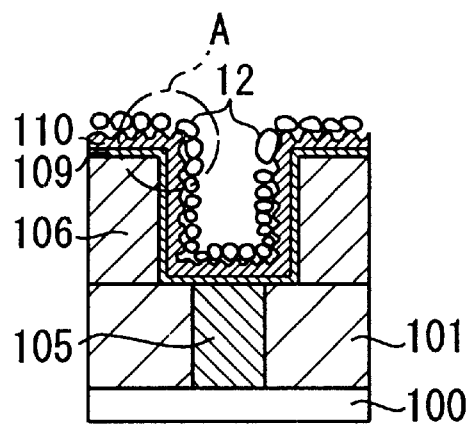

The substrate is then subjected to chemical etching (wet etching or isotropic plasma etching) while the roughened polysilicon film 12 is taken as a mask, thereby rendering the surface of the metal film 110 irregular (roughened) (see FIG. 1D). At this time, when the metal film 110 constituting the lower electrode of the capacitor is Ru, the metal film 110 is etched with $O_2$, $O_2/Cl_2$, CO, $CO/Cl_2$ gas, or aqua regia. When the metal film 110 constituting the lower electrode of the capacitor is Pt, the metal film 110 is etched in aqua regia.

Figure 1E:
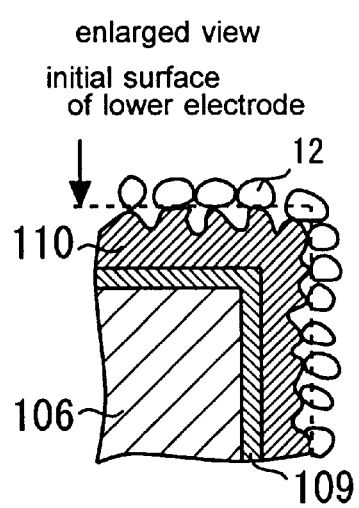

An enlarged view of a portion (designated by A) of the structure shown in FIG. 1D is shown in FIG. 1E. As shown in FIG. 1E, the surface of the metal film 110 constituting the lower electrode of the capacitor is made irregular (or roughened) as a result of the initial surface of the metal film 110 before chemical etching being etched while the roughened polysilicon film 12 is taken as a mask.

Next, the roughened polysilicon film 12 is selectively removed by means of etching through use of two chemicals; that is, hydrofluoric acid serving as a first chemical and aqueous ammonia serving as a second chemical. Thus, the metal film 110 having an irregular (roughened) surface constituting the lower electrode of the capacitor remains (see FIG. 2A).

Figure 2A:
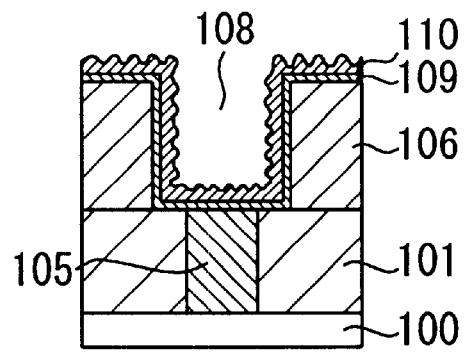
FIGS. 2A to 2C are cross-sectional views schematically depicting a configuration of the semiconductor device and a process for manufacturing the semiconductor device according to the first embodiment of the present invention.
Figure 2B:
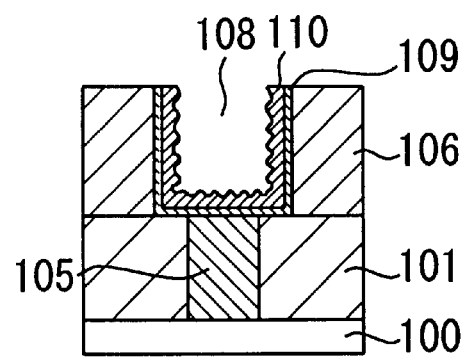
Figure 2C:
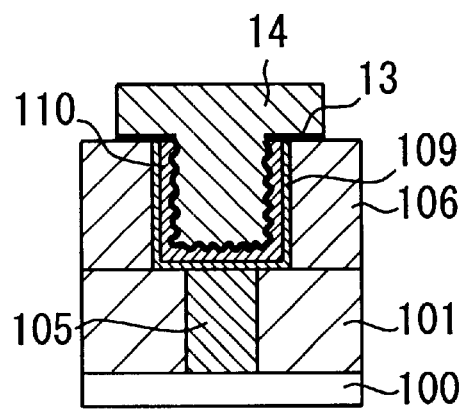

Subsequently, the barrier metal film 109 and the roughened metal film 110 constituting the lower electrode of the capacitor are removed from the upper surface of the second interlayer insulating film 106, by means of total etch-back or CMP (alternatively, the second hole 108 maybe embedded with an organic substance, such as resist, so as to protect the metal film 110, and the organic substance may be removed later) (see FIG. 2B).

In order to increase capacitance of the capacitor, a high dielectric film 13; e.g., $Ta_2O_5$, BST, or PZT, is deposited on the surface of the second interlayer insulating film 106 and the surface of the metal film 110 constituting the lower electrode of the capacitor. Then metal film (e.g., Ru, Pt, or Pt doped with iridium (Ir) for enhancing thermal stability) 14 which is to become an upper electrode of the capacitor is deposited so as to fill the second hole 108. An unillustrated resist pattern is formed, and after dry etching process, the resist pattern is removed, thus forming a capacitor of MIM structure (see FIG. 2C).

In the process shown in FIG. 1B, the doped amorphous silicon film 11 is formed on the metal film 110 which is to become a lower electrode of the capacitor. Alternatively, an amorphous silicide film ($RuSi_x$, $PtSi_x$) which is of the same metal as the metal film 110 may be formed, and silicon contained in silicide film may be subjected to roughening.

According to the first embodiment, the surface of metal film which is to become a lower electrode of a capacitor is made irregular (i.e., roughened), thereby increasing the surface area of the lower electrode of the capacitor. Thus, there can be formed a large-capacitance capacitor of MIM structure. In contrast with the invention described in Japanese Patent Application Laid-Open No. 220101/1999, the present embodiment obviates formation of columnar lower electrodes. In the embodiment, a lower electrode is formed on the wall of a hole of an interlayer insulating film or on the wall of a trench. Hence, the present embodiment obviates a problem of a short circuit being likely to be induced by etch residue, which would otherwise arise in the bottom of the lower electrode, or a problem of columnar lower electrodes being likely to fall. Thus, there can be provided a semiconductor device of enhanced reliability.

The invention described in Japanese Patent Application Laid-Open No. 220101/1999 requires formation of irregularities not on the bottom of but on the side surface of a lower electrode in order to ensure physical strength of the columnar lower electrode. In contrast, no such restrictions are imposed on the present embodiment. Further, irregularities can be formed on the bottom as well as on the side surface of the lower electrode of the capacitor. Consequently, an upward leap in capacitance of the capacitor can be achieved.

Second Embodiment

Figure 3A:
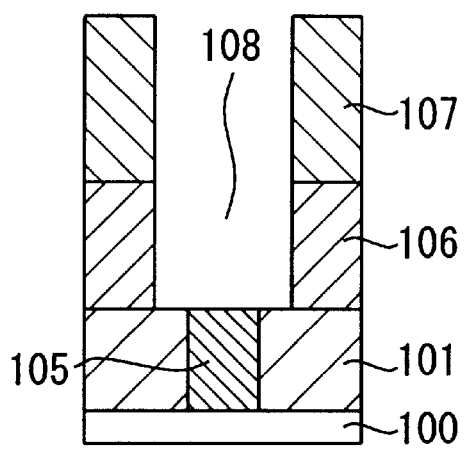
FIGS. 3A to 3F are cross-sectional views schematically depicting a configuration of the semiconductor device and a process for manufacturing the semiconductor device according to the second embodiment of the present invention.
Figure 3B:
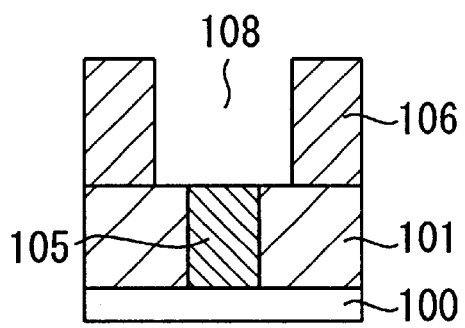

A semiconductor device according to a second embodiment of the present invention and a method of manufacturing the semiconductor device will now be described by reference to FIGS. 3A through 3F. Processes for forming a structure shown in FIG. 3B are the same as the related-art processes shown in FIGS. 9A through 9E (i.e., the structures shown in FIGS. 3A and 3B are identical with those shown in FIGS. 9D and 9E). Accordingly, illustration of the processes and their explanations are omitted here.

Figure 3C:
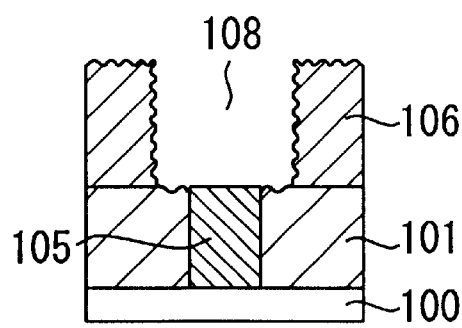
Figure 3D:
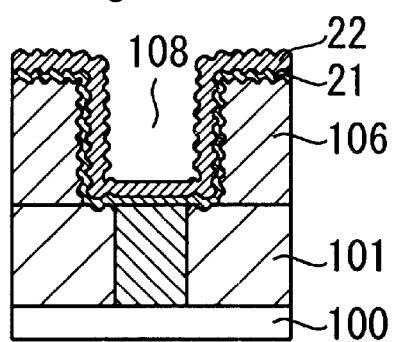

Subsequent to the state shown in FIG. 3B, a portion of the first interlayer insulating film 101 and the surface of the second interlayer insulating film 106 are made irregular (or roughened) through use of chemical dry etching (e.g., an aqueous solution of $HF+NH_4F+CH_3COOH$) (see FIG. 3C).

Barrier metal film 21; e.g., TiN, and metal film(e.g., Ru or Pt) 22 which is to become a lower electrode of a capacitor are deposited, in this sequence, on the roughened first and second interlayer insulating films 101 and 106. Irregularities (or roughness) of the surfaces of the first and second interlayer insulating films 101 and 106, which act as bases, are reflected in the thus-deposited metal film 22, so that the surface of the metal film 22 constituting the lower electrode of the capacitor also becomes irregular (or roughened) (see FIG. 3D).

Figure 3E:
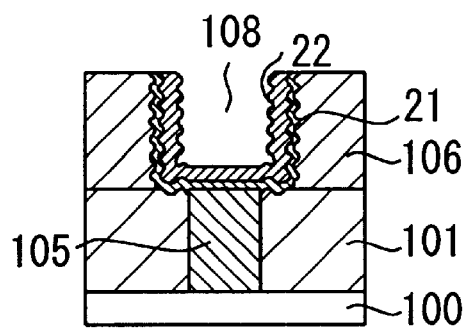
Figure 3F:
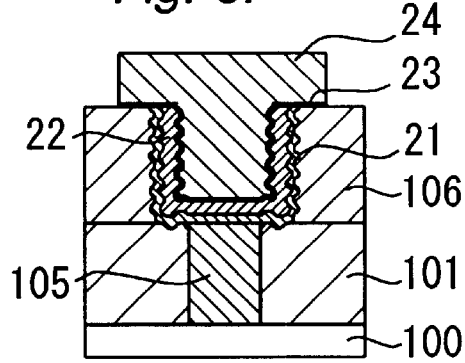

The barrier metal film 21 and the roughened metal film 22 constituting the lower electrode of the capacitor are removed from the upper surface of the second interlayer insulating film 106 (see FIG. 3E). At this time, the second hole 108 is embedded with an organic substance, such as resist, thereby protecting the metal film 22 constituting the lower electrode of the capacitor, and the organic substance is removed later.

In order to increase capacitance of the capacitor, a high dielectric film 23; e.g., $Ta_2O_5$, BST, or PZT, is deposited on the surface of the second interlayer insulating film 106 and the surface of the metal film 22 constituting the lower electrode of the capacitor. Then metal film (e.g., Ru, Pt, or Pt doped with iridium (Ir) for enhancing thermal stability) 24 which is to become an upper electrode of the capacitor is deposited so as to fill the second hole 108. An unillustrated resist pattern is formed, and after etching process, the resist pattern is removed, thus forming a capacitor of MIM structure (see FIG. 3F).

According to the second embodiment, the surface of an interlayer insulating film which is to become a base of a lower electrode of a capacitor is made irregular (or roughened). As a result, the surface of metal film which is deposited on the interlayer insulating film and is to become a lower electrode can also be made irregular (roughened). As in the case of the first embodiment, there can be fabricated a large-capacitance capacitor of MIM structure, and there can be provided a semiconductor device of enhanced reliability. In contrast with the case of the first embodiment, the process of making the surface of the metal film of the lower electrode irregular (roughened) can be made simple.

Third Embodiment

Figure 4A:
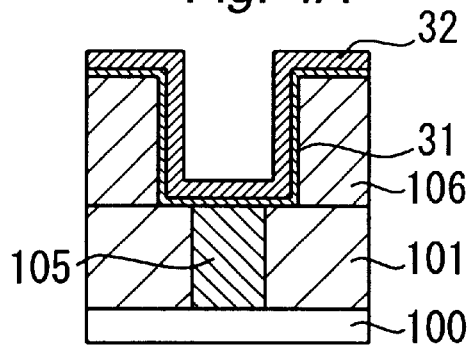
FIGS. 4A to 4F are cross-sectional views schematically depicting a configuration of the semiconductor device and a process for manufacturing the semiconductor device according to the third embodiment of the present invention.

A semiconductor device according to a third embodiment of the present invention and a method of manufacturing the semiconductor device will now be described by reference to FIGS. 4A through 4F. Processes for forming a structure shown in FIG. 4A are the same as the related-art processes shown in FIGS. 9A through 9E. Accordingly, illustration of the processes and their explanations are omitted here.

Figure 9A:
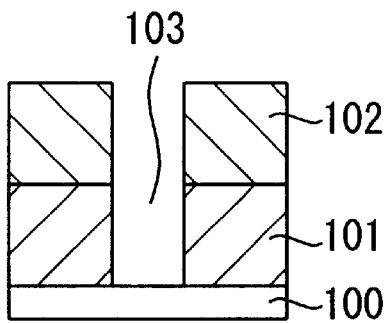
FIGS. 9A to 9F are cross-sectional views schematically depicting a process for manufacturing the semiconductor device according to the related-art.
Figure 9B:
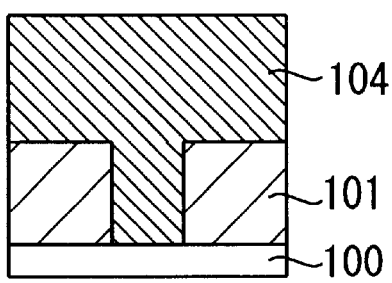
Figure 9C:
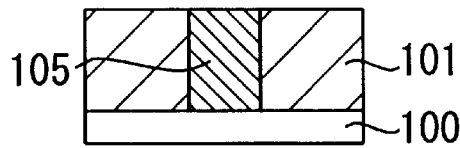
Figure 9D:
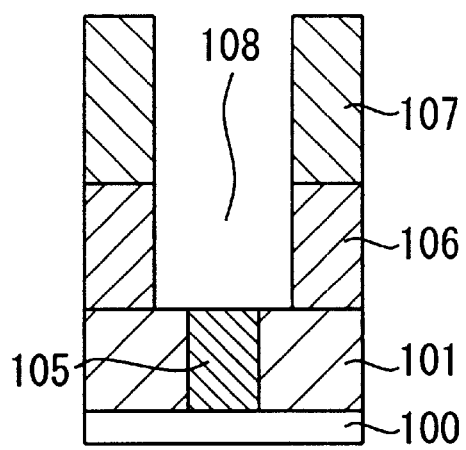
Figure 9E:
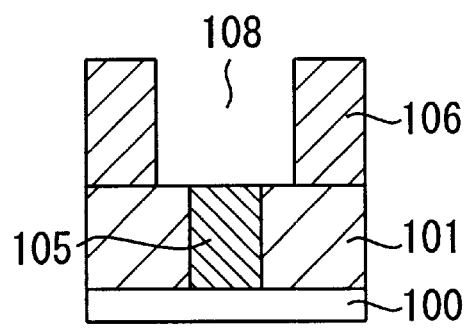
Figure 9F:
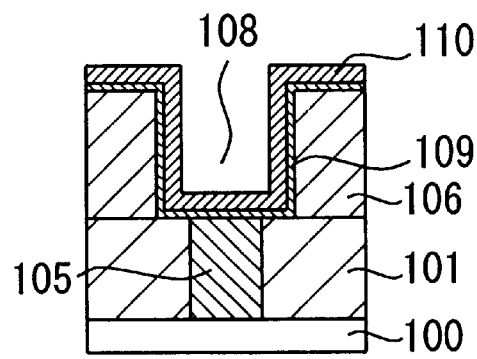
Figure 10A:
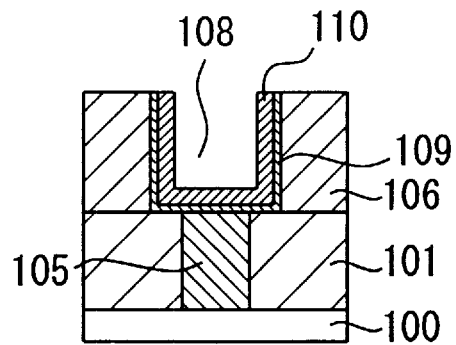
FIGS. 10A to 10C are cross-sectional views schematically depicting a process for manufacturing the semiconductor device according to the related-art.
Figure 10B:
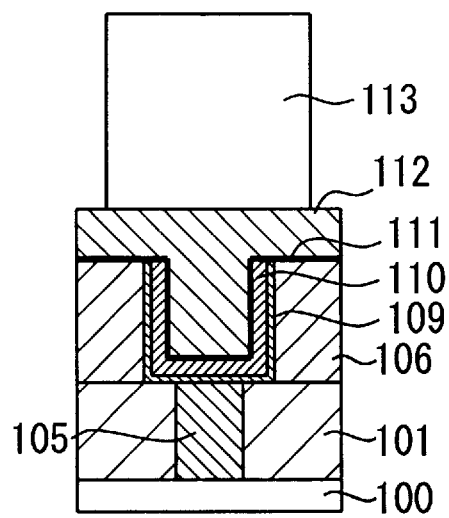
Figure 10C:
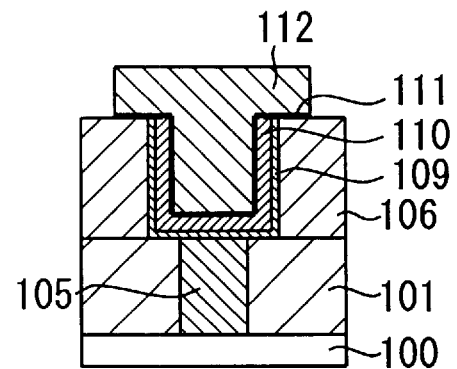

Subsequent to the state shown in FIG. 9E, barrier metal film 31; e.g., TiN, and metal film 32 (e.g., Ru) which is to become a lower electrode of a capacitor are sequentially deposited on the second interlayer insulating film 106 and the surface of the second hole 108 (see FIG. 4A). At this time, the metal film 32 to become the lower electrode of the capacitor is subjected to low-temperature treatment (at a temperature in the vicinity of 120° C., which is the dissociation temperature of DPM (dipivaloylmethanato-based organic metal)), thereby forming an amorphous film.

Figure 4C:
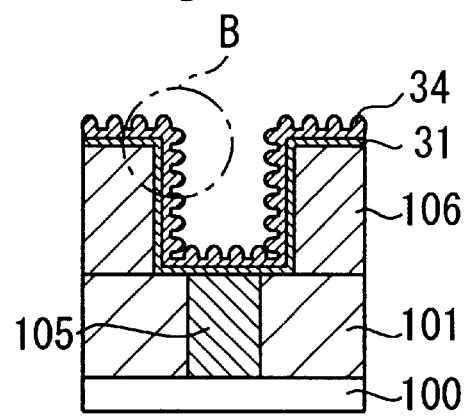
Figure 4B:
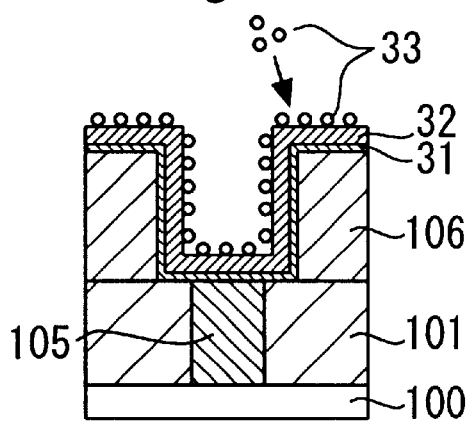

Metal nuclei 33 identical with the metal film 32 are nucleated on the metal film 32 remaining in an amorphous state (see FIG. 4B). The thus-nucleated metal film 32 is subjected to heat treatment; for example, vacuum annealing. As a result, crystals are grown from base amorphous metal (i.e., the metal film 32 constituting the lower electrode of the capacitor) while metal nuclei 33 nucleated on the metal film 32 are taken as nuclei of crystals. Subsequently, metal film 34 having an irregular (rough) surface is formed (see FIG. 4C).

Figure 4E:
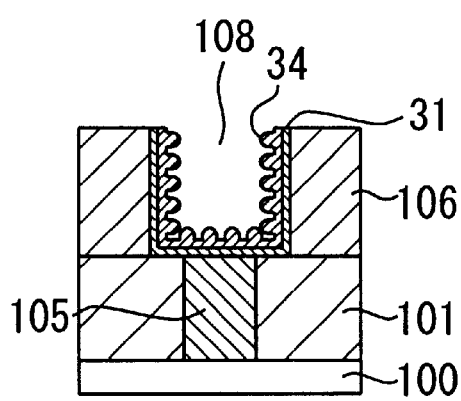
Figure 4D:
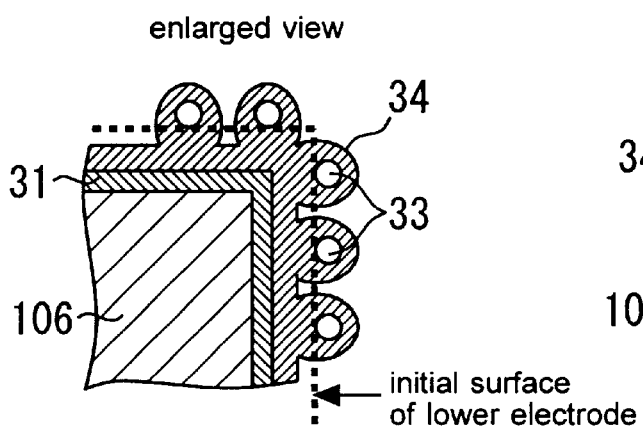
Figure 4F:
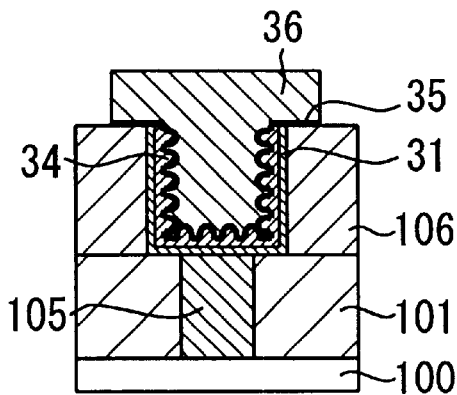

FIG. 4D shows an enlarged view of a portion of the structure shown in FIG. 4C. As shown in FIG. 4D, the metal film 32 is made irregular (or roughened) as a result of crystals being grown from an initial surface of the metal film 32 before crystal growth while the metal nuclei 33 are taken as nuclei of crystals.

Subsequently, the barrier metal film 31 deposited on the second interlayer insulating film 106 and the irregular (roughened) metal film 34 of the lower electrode of the capacitor are removed (see FIG. 4E). The second hole 108 may be embedded with an organic substance, such as resist, so as to protect the metal film 34, and the organic substance may be removed later.

In order to increase capacitance of the capacitor, a high dielectric film 35; e.g., $Ta_2O_5$, BST, or PZT, is deposited on the surface of the second interlayer insulating film 106 and the surface of the metal film 34 of the lower electrode of the capacitor. Then metal film (e.g., Ru, Pt, or Pt doped with iridium (Ir) for enhancing thermal stability) 36 which is to become an upper electrode of the capacitor is deposited so as to fill the second hole 108. An unillustrated resist pattern is formed, and after dry etching process the resist pattern is removed, thus forming a capacitor of MIM structure (see FIG. 4F).

According to the third embodiment, the surface of metal film which is to become a lower electrode of a capacitor is made irregular (i.e., roughened),thereby increasing the surface area of the lower electrode of the capacitor. As in the case of the first embodiment, a large-capacitance capacitor of MIM structure can be formed and a semiconductor device of enhanced reliability can be provided. Further, as compared with the first embodiment, the present embodiment can facilitate manufacturing processes for rendering irregular (rough) the surface of the metal film of the lower electrode.

Figure 5A:
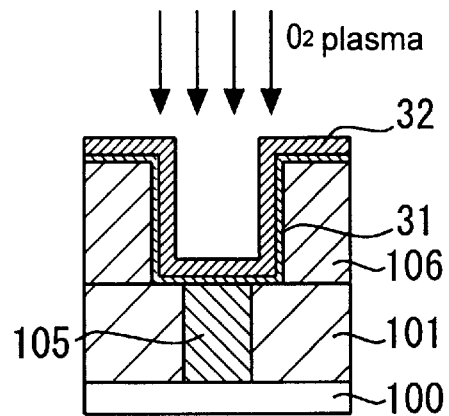
FIGS. 5A to 5C are cross-sectional views schematically depicting a configuration of the semiconductor device and a process for manufacturing the semiconductor device according to the modification of the third embodiment of the present invention.
Figure 5B:
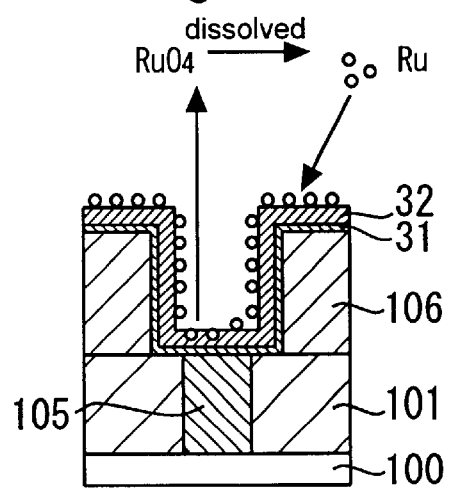
Figure 5C:
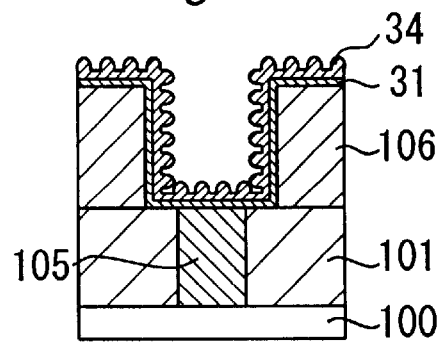

FIGS. 5A through 5C show a modification of the method of manufacturing a semiconductor device according to the third embodiment. The structures shown in FIGS. 5A through 5C are identical with those shown in FIGS. 4A through 4C.

As shown in FIG. 5A, the surface of the metal film(Ru) 32 which is to become a lower electrode of a capacitor is exposed to oxygen plasma radiation under a predetermined set of conditions; that is, a wafer temperature of 200° C. or more (a high temperature condition) and a pressure of 0.5 Torr (67 Pa) (a high pressure condition). The metal film 32 produces a volatile reaction product $RuO_4$. Under the above-described high temperature and high pressure conditions, the reaction product $RuO_4$ is dissolved to thereby become Ru again while remaining in a chamber, thus discharging oxygen. Ru is re-crystallized on the metal film 32 of the lower electrode of the capacitor (see FIG. 5B). The structure is subjected to vacuum annealing, so that the metal film 32 remaining in an amorphous state is grown to a crystal. In this way, there can be formed irregular (rough) metal film 34 which is to become a lower electrode of a capacitor (see FIG. 5C).

Figure 6A:
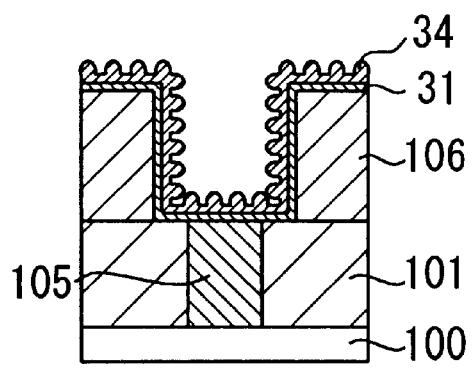
FIGS. 6A to 6D are cross-sectional views schematically depicting a configuration of the semiconductor device and a process for manufacturing the semiconductor device according to the another modification of the third embodiment of the present invention.
Figure 6D:
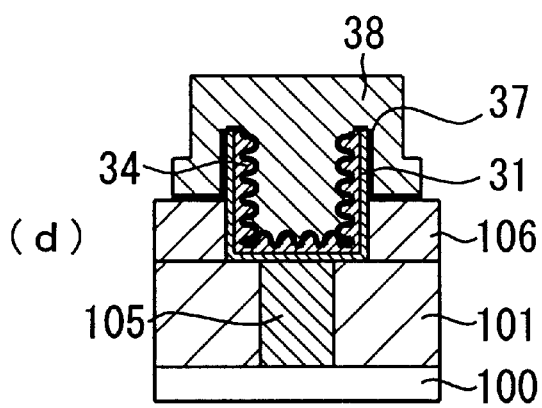
Figure 6B:
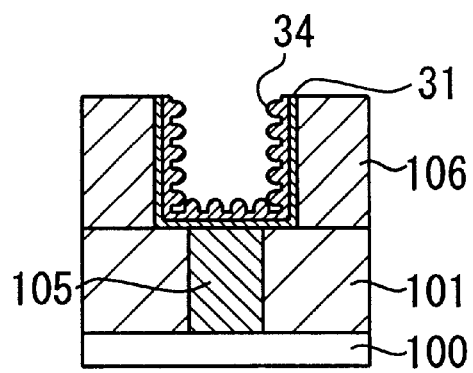

FIGS. 6A through 6D show another modification of the method of manufacturing a semiconductor device according to the third embodiment. The structures shown in FIGS. 6A and 6B are identical with those shown in FIGS. 4C and 4E.

Figure 6C:
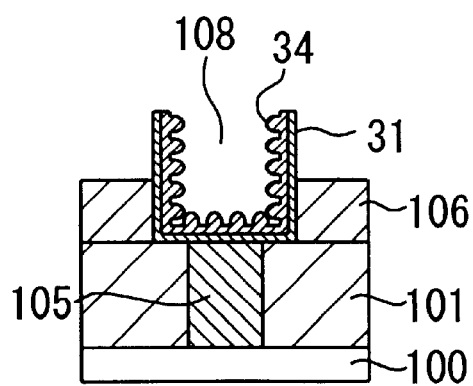

Subsequent to the state of the structure shown in FIG. 6B, the second interlayer insulating film 106 is etched back in order to increase the capacitance of a capacitor (see FIG. 6C). A high dielectric film 37; e.g., $Ta_2O_5$, BST, or PZT, is deposited on the surface of the second interlayer insulating film 106 and the surface of the metal film 34 of the lower electrode of the capacitor. The high dielectric film 37 is deposited on a portion of the undersurface of the second hole 108 which has been exposed as a result of etch-back of the second interlayer insulating film 106.

Then metal film (e.g., Ru, Pt, or Pt doped with iridium (Ir) for enhancing thermal stability) 38 which is to become an upper electrode of the capacitor is deposited on the high dielectric film 37 so as to fill the second hole 108. An unillustrated resist pattern is formed, and after dry etching process, the resist pattern is removed, thus forming a capacitor of MIM structure (see FIG. 6D).

As mentioned above, the surface area of the capacitor can be increased further by utilization of the area of the exposed portion of the undersurface of the second hole 108, by means of etching back the second interlayer insulating film 106 (in this case, a resultant capacitor assumes a cylindrical shape). Thus, the capacitance of the capacitor can be increased further.

The modification shown in FIGS. 6A through 6D can be applied also to first and second embodiments or fourth and fifth embodiments to be described later. Particularly, applied to second embodiment, the exposed portion of the undersurface of the second hole 108 is made irregular (rough), and hence the surface area of the capacitor can be effectively enlarged.

Fourth Embodiment

Figure 7A:
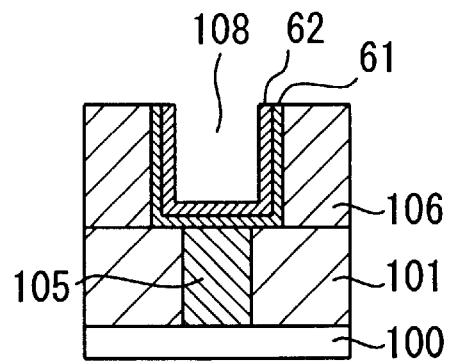
FIGS. 7A to 7C are cross-sectional views schematically depicting a configuration of the semiconductor device and a process for manufacturing the semiconductor device according to the fourth embodiment of the present invention.
Figure 7B:
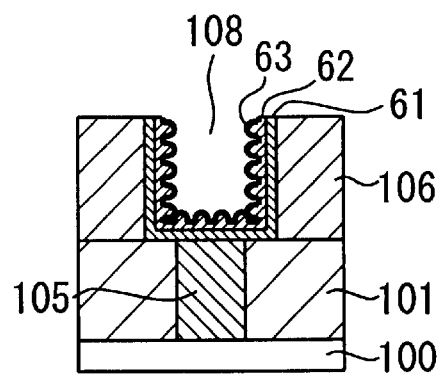
Figure 7C:
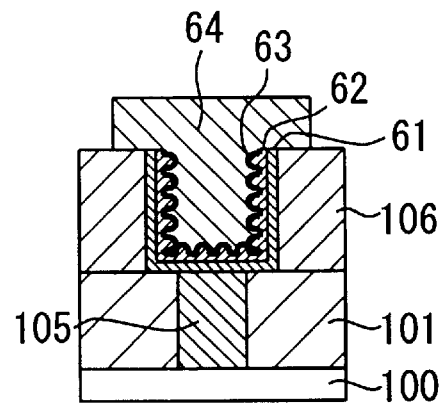

A semiconductor device according to a fourth embodiment of the present invention and a method of manufacturing the semiconductor device will now be described by reference to FIGS. 7A through 7C. Processes for forming a structure shown in FIG. 7A are the same as the related-art processes shown in FIGS. 9A through 9E. Illustration of the processes and their explanations are omitted here.

Subsequent to the state shown in FIG. 9E, metal Ti/TiN (titanium/titanium nitride) film 61 which is to become barrier metal film and metal Al (aluminum) film 62 which is to become a lower electrode of a capacitor are formed, in this sequence from below, on the second hole 108 formed in the second interlayer insulating film 106 (see FIG. 7A). Subsequently, the structure is subjected to hot water treatment or oxygen plasma treatment, whereby an $Al_2O_3$ (aluminum oxide) film 63 is formed on the surface of the metal film(Al) 62 of the lower electrode of the capacitor (see FIG. 7B). At this time, the surface of the metal film 62 becomes irregular, and the $Al_2O_3$ coating film 63 acts as a superior dielectric film.

Then metal film (e.g., Ru, Pt, or Pt doped with iridium (Ir) for enhancing thermal stability) 64 which is to become an upper electrode of the capacitor is deposited so as to fill the second hole 108. An unillustrated resist pattern is formed, and after dry etching process, the resist pattern is removed, thus forming a capacitor of MIM structure (see FIG. 7C).

According to the fourth embodiment, the surface of metal film which is to become a lower electrode of a capacitor is made irregular (i.e., roughened). As in the case of the first embodiment, a large-capacitance capacitor of MIM structure can be formed and a semiconductor device of enhanced reliability can be provided. Further, as compared with the first embodiment, the present embodiment can facilitate manufacturing processes for rendering irregular (rough) the surface of the metal film of the lower electrode.

Particularly, in the present embodiment, the barrier metal film 61 and the metal film 62 of the lower electrode of the capacitor are deposited on only the second hole 108. Hence, there is no necessity for subjecting the barrier metal film 61 and the metal film 62 to total etch-back or CMP. Moreover, the $Al_2O_3$ film 63 acts as a superior dielectric film, and hence processing for depositing a high dielectric film, such as $Ta_2O_5$, BST, or PZT, can be obviated. Thus, the number of processing steps is diminished, thereby curtailing manufacturing costs.

Fifth Embodiment

Figure 8A:
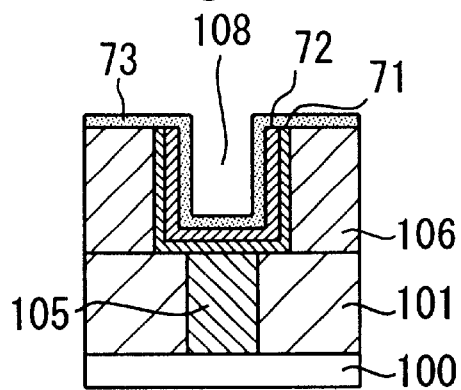
FIGS. 8A to 8C are cross-sectional views schematically depicting a configuration of the semiconductor device and a process for manufacturing the semiconductor device according to the fifth embodiment of the present invention.
Figure 8B:
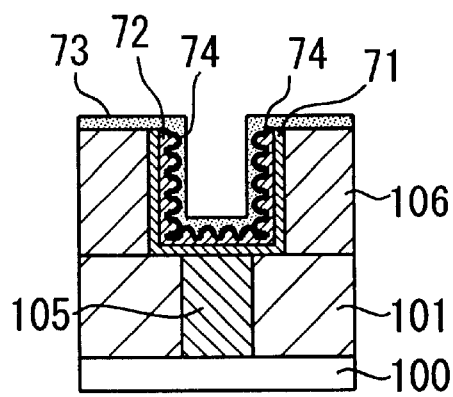
Figure 8C:
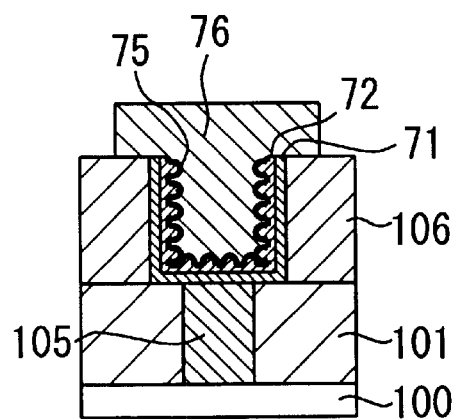

A semiconductor device according to a fifth embodiment of the present invention and a method of manufacturing the semiconductor device will now be described by reference to FIGS. 8A through 8C. Processes for forming a structure shown in FIG. 8A are the same as the related-art processes shown in FIGS. 9A through 9E. Illustration of the processes and their explanations are omitted here.

Subsequent to the state shown in FIG. 9E, metal film(Ti/TiN) 71 which is to become barrier metal film and metal film (e.g., W (tungsten)) 72 which is to become a lower electrode of a capacitor and is more electrically positive than silicon are formed, in this sequence from below, on the second hole 108 formed in the second interlayer insulating film 106. Further, polycrystalline silicon film 73 is thinly formed on the metal film 71, 72 and the surface of the second interlayer insulating film 106 (see FIG. 8A). Subsequently, the structure is subjected to heat treatment and silicided (thereby causing tungsten film 72 to react with silicon film 73), thus rendering the surface of the tungsten film 72 irregular (rough) (see FIG. 8B).

Next, the polycrystalline silicon film 73 and the tungsten silicide film 74 are selectively removed by means of etching, thereby uncovering tungsten film 72 having an irregular (rough) surface. Then a high dielectric film 75; e.g., $Ta_2O_5$, BST, or PZT, is deposited on the surface of the second interlayer insulating film 106 and the surface of the metal film 72 constituting the lower electrode of the capacitor. Then metal film (e.g., Ru, Pt, or Pt doped with iridium (Ir) for enhancing thermal stability) 76 which is to become an upper electrode of the capacitor is deposited so as to fill the second hole 108. An unillustrated resist pattern is formed, after dry etching process the resist pattern is removed, thus forming a capacitor of MIM structure (see FIG. 8C).

According to the fifth embodiment, the surface of metal film which is to become a lower electrode of a capacitor is made irregular (i.e., roughened). As in the case of the first embodiment, a large-capacitance capacitor of MIM structure can be formed and a semiconductor device of enhanced reliability can be provided. Further, as compared with the first embodiment, the present embodiment can facilitate manufacturing processes for rendering irregular (rough) the surface of the metal film of the lower electrode.

The embodiments set forth merely show specific examples of implementation of the present invention, and do not impose limitations on interpretation of technological scope of the invention. The present invention can be implemented in various forms without departing from the spirit or primary features of the present invention.

The features and the advantages of the present invention as described above may be summarizes as follows.

According to one aspect, a semiconductor device includes a capacitor of metal-insulator-metal (MIM) structure, and the surface of a lower electrode of the capacitor is formed roughly (irregularly), and hence the surface area of the capacitor is increased. Thus, a large-capacitance capacitor of MIM structure can be formed.

In another aspect, the lower electrode is formed on the wall of a hole or trench of an interlayer insulating film. As a result, there can be prevented a problem of occurrence of a short circuit being liable to arise or a problem of a columnar lower electrode becoming liable to fall, which would otherwise be caused by etch residues formed on the bottom of a lower electrode when the lower electrode is formed into a columnar shape. Thus, a highly-reliable semiconductor device can be provided. Moreover, the bottom as well as the side surface of the lower electrode can be roughened, and hence an upward leap in capacitance of the capacitor can be achieved.

According to a method of manufacturing a semiconductor device including a capacitor whose surface of the lower electrode is rough (irregular), an interlayer insulating film which is to become a base of the lower electrode is etched, thereby roughening the surface of the interlayer insulating film. A lower electrode is formed on the thus-roughened interlayer insulating film and subjected to film growth operation such that the surface of the electrode becomes rough. As a result, processes for manufacturing a semiconductor device can be facilitated.

According to a method of manufacturing a semiconductor device including a capacitor whose lower electrode is rough (irregular), after a lower electrode has been produced in amorphous form, metal identical with that of the lower electrode is nucleated on the surface of the lower electrode. The metal lower electrode in amorphous form is subjected to crystal growth by means of heat treatment, so that the surface of the lower electrode is roughened. As a result, processes for manufacturing a semiconductor device can be facilitated.

According to a method of manufacturing a semiconductor device including a capacitor whose lower electrode is rough (irregular), a lower electrode is formed from aluminum. The lower electrode is subjected to hot water treatment or oxygen plasma treatment, thereby roughening the surface of the lower electrode. Further, an oxidative product of aluminum is formed on the surface of the lower electrode. As a result, the oxidative product of aluminum acts as a superior capacitive insulator. Hence, there can be obviated a necessity for performing an operation for depositing a high dielectric film on the lower electrode. Further, there can be obviated a necessity for performing an operation for removing a lower electrode from areas other than a hole or trench formed in the interlayer insulating film. Hence, processes for manufacturing a semiconductor device can be facilitated.

According to a method of manufacturing a semiconductor device including a capacitor whose lower electrode is rough (irregular), there can be sequentially formed a lower electrode from metal film (e.g., tungsten) which is more electrically positive than silicon, and silicon film from below. The metal film of the lower electrode and silicon film are subjected to heat treatment, so that the metal film is silicided. Thus, the surface of the lower electrode is roughened, thereby facilitating processes for manufacturing a semiconductor device.

According to a method of manufacturing a semiconductor device including a capacitor whose lower electrode is rough (irregular), an interlayer insulating film serving as a base of a lower electrode is etched back, thereby uncovering the undersurface of a hole or trench. Thus, the surface area of the capacitor is increased further, thereby enabling fabrication of a large-capacitance capacitor of MIM structure.

Beside the claimed invention, the present invention includes various aspects as described above and summarized as follows.

According to one aspect of the present invention, a method of manufacturing the semiconductor device having a capacitor of metal-insulator-metal structure, the capacitor comprising an upper metal electrode, a lower metal electrode, and a capacitive dielectric film formed between the upper and lower electrodes, wherein the surface of the lower electrode is rough, comprises the following steps. The amorphous silicon film or amorphous metal silicide film is formed on the lower electrode firstly. The silicon of the silicon film or the amorphous metal silicide film is roughened, thereby form rough polysilicon secondly. Metal film of the lower electrode is etched while the rough polysilicon is taken as a mask, thereby the surface of the lower electrode is roughened thirdly. The rough polysilicon is removed fourthly.

According to another aspect of the present invention, the method of manufacturing the semiconductor device having the capacitor comprises the following steps. The interlayer insulating film which is to become a base of the lower electrode is etched, thereby the surface of the interlayer insulating film is roughened firstly. A film to form the lower electrode is formed on the roughened interlayer insulating film such that the surface of the lower electrode becomes rough secondly.

According to another aspect of the present invention, the method of manufacturing the semiconductor device having the capacitor comprises the following steps. The lower electrode in amorphous form is formed firstly. Nuclei are formed on the surface of the lower electrode from the same metal as that of the lower electrode, then the surface of the lower electrode in amorphous form is roughening by means of heat treatment secondly.

According to another aspect of the present invention, the method of manufacturing the semiconductor device having the capacitor comprises the following steps. The lower electrode is formed in amorphous form firstly. Oxygen plasma is radiated to the surface of the lower electrode in amorphous form, thereby the surface of the lower electrode is roughened secondly.

According to another aspect of the present invention, a method of manufacturing the semiconductor device having the capacitor comprises the following steps. The lower electrode is formed from aluminum firstly. The lower electrode is subjected to hot water treatment or oxygen plasma processing, thereby the surface of the lower electrode made of aluminum is roughened and an oxide product of aluminum is formed on the surface of the lower electrode secondly.

According to another aspect of the present invention, the method of manufacturing the semiconductor device having the capacitor comprises the following steps. The lower electrode from metal film which is more electrically positive than silicon, and silicon film is sequentially formed firstly. Metal film of the lower electrode and the silicon film is subjected to heat treatment, thereby silicidation is effected and the surface of the lower electrode is roughened by forming silicide film secondly. The silicon film and the silicide film is selectively removed thirdly.

According to another aspect of the present invention, a method of manufacturing the semiconductor device having a capacitor of metal-insulator-metal structure, the capacitor comprising an upper metal electrode, a lower metal electrode, and a capacitive dielectric film formed between the upper and lower electrodes, wherein the surface of the lower electrode is rough and the lower electrode is formed on a hole or trench formed in an interlayer insulating film, comprises the following steps. The interlayer insulating film is etched, thereby a hole or trench into which the lower electrode is to be inserted is formed firstly. The interlayer insulating film having the hole or trench is etched, thereby the surface of the interlayer insulating film is roughened secondly. The lower electrode is formed on the roughened interlayer insulating film such that the surface of the lower electrode becomes rough thirdly. The lower electrode roughly formed on the interlayer insulating film is removed such that a portion of the lower electrode remains in the hole or trench fourthly. The capacitive dielectric film, and the upper electrode is sequentially formed on the lower electrode fifthly.

According to another aspect of the present invention, the method of manufacturing the semiconductor device having the capacitor comprises the following steps. The interlayer insulating film is etched, thereby a hole or trench into which the lower electrode is to be inserted is formed firstly. The lower electrode is formed in amorphous form on the interlayer insulating film having the hole or trench secondly. Oxygen plasma is radiated onto the surface of the lower electrode in amorphous form, thus the surface of the lower electrode is roughened thirdly. The lower electrode roughly formed on the interlayer insulating film is removed such that a portion of the lower electrode remains in the hole or trench fourthly. The capacitive dielectric film, and the upper electrode is sequentially formed on the lower electrode fifthly.

According to another aspect of the present invention, the method of manufacturing the semiconductor device having the capacitor comprises the following steps. The interlayer insulating film is etched, thereby a hole or trench into which the lower electrode is to be inserted is formed firstly. The lower electrode is formed from aluminum on the wall of the hole or trench formed in the interlayer insulating film secondly. The lower electrode is subjected to hot water treatment or oxygen plasma processing, thereby the surface of the lower electrode made of aluminum is roughened and an oxide product of aluminum is formed on the surface of the lower electrode thirdly. The upper electrode is formed on the oxide product of aluminum roughly formed on the wall of the hole or trench fourthly.

According to another aspect of the present invention, a method of manufacturing the semiconductor device having the capacitor comprises the following steps. The interlayer insulating film is etched, thereby a hole or trench into which the lower electrode is to be inserted is formed firstly. The lower electrode from tungsten film, and silicon film is sequentially formed on the interlayer insulating film having the hole or trench secondly. The tungsten and the silicon film is silicided by means of heat treatment, thus the surface of the lower electrode is roughened thirdly. The silicon film and the silicide film is selectively is removed fourthly. The capacitive dielectric film, and the upper electrode is sequentially formed on the lower electrode fifthly.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-19242, filed on Jan. 26, 2001 including specification, claims, drawings and summary, on which the Convention priority of the present application is based, are incorporated herein by reference in its entirety.

What is claimed is:

1. A method of manufacturing a semiconductor device having a capacitor of metal-insulator-metal structure, the capacitor comprising an upper metal electrode, a lower metal electrode, and a capacitive dielectric film formed between said upper and lower metal electrodes, wherein the surface of said lower metal electrode is rough and said lower metal electrode is formed on a surface of a hole or trench formed in an interlayer insulating film, the method comprising the steps of:

etching an interlayer insulating film to thereby form a hole or trench;

forming a lower metal electrode on the surface of the interlayer insulating film including the surface of said hole or trench formed therein;

forming an amorphous silicon film or amorphous metal silicide film on said lower metal electrode;

roughening said amorphous silicon film or said amorphous metal silicide film thereby forming rough polysilicon;

etching said lower metal electrode while said rough polysilicon is taken as a mask, thereby roughening the surface of said lower metal electrode;

removing said rough polysilicon;

removing said lower metal electrode on said interlayer insulating film such that a portion of said lower metal electrode remains on the surface of said hole or trench;

forming a capacitive dielectric film on the lower metal electrode; and forming an upper metal electrode on the capacitive dielectric film.

* * * * *